ELECTRICAL ASSEMBLY OF MODULES

Filed July 13, 1960

INVENTOR
JOSEPH FRIEDMAN
BY
ATTORNEY

INVENTOR
JOSEPH FRIEDMAN
BY
ATTORNEY

INVENTOR
JOSEPH FRIEDMAN
BY
[signature]
ATTORNEY

United States Patent Office 3,113,248

Patented Dec. 3, 1963

3,113,248
ELECTRICAL ASSEMBLY OF MODULES

Joseph Friedman, Westbury, N.Y., assignor to Sperry Rand Corporation, Great Neck, N.Y., a corporation of Delaware Filed July 13, 1960, Ser. No. 42,628
7 Claims. (Cl. 317—101)

This invention relates to electrical assemblies and methods of manufacturing electrical assemblies compactly. The invention also relates to assemblies having a plurality of electrical modules and improved methods of compactly packaging assemblies of this type requiring a minimum of design effort while providing ready accessibility for maintenance.

In the development and utilization of electrical equipment, particularly digital computers, the physical size of the overall equipment becomes of greater importance as the degree of complexity and the number of electrical components in the equipment increase. Much development time and effort is spent in reducing the size of electrical equipment so that a greater variety of useful functions may be performed with equipment that occupies the smallest volume of space.

The problem then is to provide the highest density of electrical components within a given volume. One portion of this problem is solved by utilizing electrical modules wherein each module encapsulates a plurality of electrical components which are generally interconnected to form an individual circuit. The components may be potted by means of an epoxy resin in order that the shape of the module may be in the form of a cube having pin connections or terminals extending therefrom which connect to the components within the module.

Obviously the highest density of electrical components in a given volume will be obtained by having the size of the entire equipment limited only by the size of the individual modules utilized in its construction. Usually however, more space is required by the electrical wires interconnecting the modules than is required for the modules themselves. Some saving in space is accomplished by utilizing printed circuit conductors interconnecting the modules but this technique per se is still extremely wasteful of space. Further, the packing density then depends upon the complexity of the equipment and the cleverness of the designer in designing the interconnections between the modules. This problem is further aggravated by the maintenance requirement which necessitates being able to determine whether each of the circuits within the modules is operating satisfactorily and providing ready accessibility to the module if replacement is required.

The present invention overcomes the aforementioned limitations of the prior art by utilizing a printed wiring harness consisting of two overlapping layers of insulated printed electrical conductors. Each of the conductors in one layer is parallel to each of the other conductors in the same layer and perpendicular to each of the conductors in the other layer thereby forming a lattice of overlapping printed conductors. Each of a plurality of electrical modules is connected to a respective conductor in each of the overlapping layers of conductors. The modules and the conductors are so disposed and relatively arranged that any of the modules may be connected to any other module by means of the conductor lattice by interconnecting selected overlapping conductors at points where they overlap.

To obtain the maximum packaging density, the printed wiring harness is flexible and the modules are so disposed that when the harness is folded along predetermined lines, the modules are stacked in close proximity, one on top of the other, with the flexible harness wrapped around the stacked modules thereby forming an electrical assembly in the shape of a column. The space inside the column is filled primarily by the modules with the conductors readily accessible to provide input or output connections to and from the module terminals. The assembly is easily disassembled for replacement of a module or for changes in the connections between the overlapping conductors. Further, by means of the conductor lattice, the design of a multiplicity of complex circuits within the electrical equipment is reduced from an extremely complex design, wiring and packaging problem to merely an interconnection problem which may be readily solved by means of a simple table of interconnections.

Accordingly, it is a primary object of the present invention to provide an electrical assembly having a high density of electrical components for a given unit volume.

It is an additional object of the present invention to provide an electrical assembly that is compact and requires a minimum of original design effort.

It is a further object of the present invention to provide an improved packaging of an electrical assembly having electrical modules wherein each module is readily accessible for checking and replacement.

It is another object of the present invention to provide an electrical assembly of a complex electrical equipment in which the design problems are reduced to a simple arithmetic or bookkeeping operation.

Another object of the present invention is to provide a method of assembling electrical assemblies wherein the aforementioned objects are achieved.

These and other objects will appear from the following specification and claims when read in conjunction with the drawings in which:

Figures 1, 2, 7, 8, 9, 10:
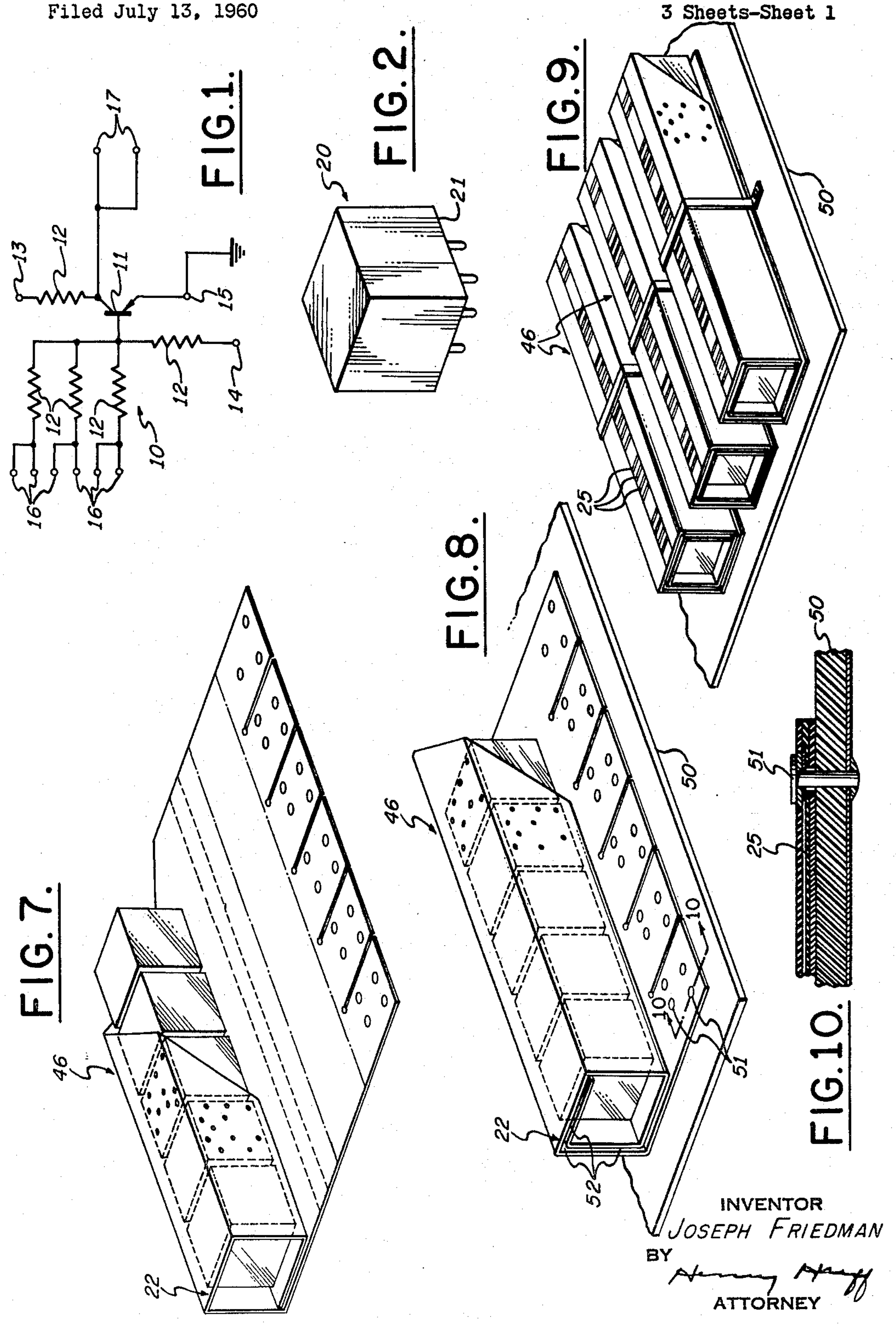
FIG. 1 is a wiring schematic diagram of a typical circuit used in a digital computer.
FIG. 2 is an electrical module within which the circuit of FIG. 1 is encapsulated.
FIG. 7 shows a step in the folding operation of the assembly of FIG. 3.
FIG. 8 shows a further step in the folding operation of the assembly of FIG. 3.
FIG. 9 shows a plurality of folded electrical assemblies mounted on a rigid printed circuit board.
FIG. 10 is a section along lines 10—10 of FIG. 8 showing one method of connecting the folded electrical assembly to the rigid wiring board.

In electrical equipment, such as digital computers, a very large number of circuits are utilized, many of which are interconnected with other circuits of the same or different type. For purposes of example, the present invention will be explained with respect to an application of this type where all of the circuits are the same. A typical circuit as shown in FIG. 1 is a multiple-input logic gate circuit 10 which includes electrical components in the form of a transistor 11 and resistors 12. The circuit 10 is adapted to be connected to a power source by means of power terminals 13 and 14 and to ground potential by means of a ground terminal 15. The circuit 10 is adapted to receive input signals by means of its six input terminals 16 and to provide output signals by means of its two output terminals 17.

Preferably, as shown in FIG. 2 the circuit 10 is encapsulated by being potted in an electrical module 20. Preferably, the module 20 is in the form of a cube or other rectangular parallelepiped with the aforementioned terminals of the circuit 10 extending from one side 21 thereof. The terminals extending from the module 20 have a predetermined orientation for reasons to be described with respect to FIG. 3.

Figures 3, 4, 5, 6, 11:
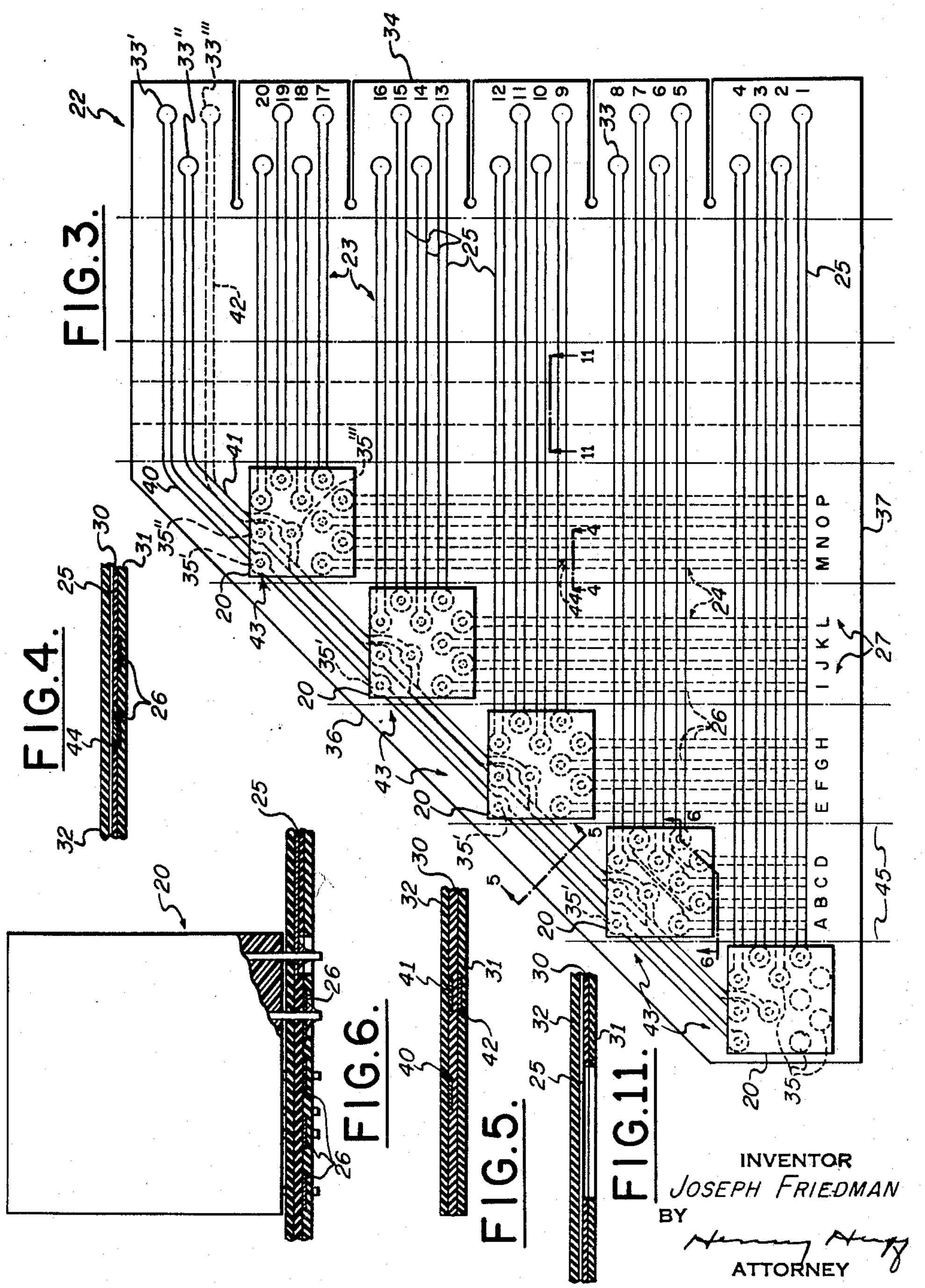
FIG. 3 is a plan view of the electrical assembly before folding having a plurality of modules mounted on the wiring harness.
FIG. 4 is a section taken along lines 4—4 of FIG. 3 showing a cross-section of the wiring harness and an interconnection between overlapping conductors.
FIG. 5 is a section along lines 5—5 of FIG. 3 showing the relation of the power and ground conductors.
FIG. 6 is a section along lines 6—6 of FIG. 3 showing a typical module connected to the wiring harness.
FIG. 11 is a section along lines 11—11 of FIG. 3 showing the conductors bared for testing purposes.

Referring now to FIG. 3, to provide a compact electrical assembly having a high density of electrical components within a given volume, a plurality of identically shaped electrical modules 20 are connected by means of their respective terminals to a flexible printed wiring harness 22 which is substantially in the shape of a truncated right triangle. The harness 22 consists of first and second overlapping layers 23 and 24 of printed electrical conductors 25 and 26 respectively. As viewed in FIG. 3, the electrical conductors 25 of the first layer 23 are shown as horizontal pairs of solid lines while the electrical conductors 26 of the second layer 24 are shown as vertical pairs of dotted lines. The conductors 25 in the first layer 23 are parallel to each other and substantially perpendicular to the conductors 26 in the second layer 24. Similarly, the conductors in the second layer 24 are parallel to each other and substantially perpendicular to each of the conductors 25 in the first layer 23 thereby forming a lattice or grid 27 of overlapping printed conductors. Each of the conductors is insulated. This may be conveniently accomplished as shown in FIG. 4 by printing the conductors 25 on the top of a flexible dielectric sheet 30 and printing the conductors 26 on the top of a second dielectric sheet 31 and then securing the top of sheet 31 to the bottom of sheet 30 in order that the two overlapping layers 23 and 24 of printed electrical conductors 25 and 26 respectively are separated by the sheet 30. To prevent the conductors 25 from coming in contact with themselves or each other, a third sheet 32 of dielectric material may be secure to the top of the first sheet 30.

Referring again to FIG. 3, each of the conductors 25 of the first layer 23 extends horizontally from a signal pad 33 near the arm 34 of the right triangle formed by the harness 22 to a respective terminal pad 35 near the hypotenuse 36 of the right triangle. Each of the conductors 26 of the second layer 24 extends vertically from a point directly below the lowest conductor 25 as viewed in FIG. 3 near the other arm 37 of the right triangle to a respective terminal pad 35 near the hypotenuse 36. The signal pads 33 may be connected to receive or transmit signals from and to other circuits in other portions of the electrical equipment.

In addition to the lattice 27, the harness 22 may also include additional printed electrical conductors disposed parallel to the hypotenuse 36 that connect with each of the modules 20. For example, a ground potential conductor 40 may be connected to terminal pads 35′ and to a ground pad 33′ while power conductors 41 and 42 may be connected to terminal pads 35″ and 35‴ respectively. The power conductors 41 and 42 connect to a power source through power pads 33″ and 33‴ respectively. As shown more clearly in FIG. 5, the ground conductor 40 and the power conductor 41 may be imprinted on the same side of the sheet 30 as the conductors 25 with the power conductor 42 imprinted on the same side of sheet 31 as the conductors 26. The power conductor 42 may lie along the hypotenuse 36 below the power conductor 41 except where it connects to the terminal pads 35‴. For additional compactness the upper portion, as viewed in FIG. 3, of the triangle formed by the arms 34 and 37 and the hypotenuse 36 may be truncated as shown.

The number and orientation of the terminal pads 35, 35′, 35″ and 35‴ forming a particular terminal pad cluster 43 is determined by the type and orientation of the circuit 10 within the module 20, the interrelation of the circuit 10 with the remainder of the equipment, and the packing density desired. The number and orientation of the terminal pads of a cluster 43 corresponds with the number and orientation of the terminals of a module 20. For example, the circuit 10 of FIG. 1 has six input terminals 16, two output terminals 17, two power terminals 13 and 14 and one ground terminal 15 requiring a terminal pad cluster 43 of eleven terminal pads on the harness 22. The embodiment of the invention shown in FIG. 3 is designed with five identical clusters 43 to accommodate five identical modules 20 of the type which enclose a circuit 10 for purposes of example.

The identically shaped modules 20 are connected by means of their respective terminals extending from the same side 21 to a terminal pad cluster 43. Each of the modules 20 is connected by means of its respective terminals to conductors 25 and 26 of the first and second layers 23 and 24 respectively, as shown more clearly in FIG. 6, where the terminals of a module 20 are connected to the terminal pads of a cluster 43 by soldering the terminals to the pads which are bare of insulation. Further, the modules 20 are disposed adjacent to each other in stair step fashion with the diagonals of their respective sides 25 aligned and parallel to the hypotenuse 36. The modules 20 and the conductors 25 and 26 are thus disposed and relatively arranged in order that any of the modules 20 may be connected to any other module 20 by means of the lattice 27 by merely connecting the associated conductors 25 and 26 at points where they overlap. The conductor 25 may be connected to the conductor 26 by electrically conductive means, for example, as shown in FIG. 4 by means of a weld 44 in order to connect, as shown in FIG. 3, the middle module 20 with the uppermost module 20.

By the above described arrangement, it will be appreciated that any electrical component in any one of the modules 20 may be connected to any other electrical component in another module 20 by merely providing an electrical connection between their conductors 25 and 26 at the point where they overlap. By numbering the conductors 25 along the arm 34 sequentially starting at the bottom and sequentially designating the conductors 26 along the arm 37 alphabetically starting at the left, a table of interconnections points in the form of grid coordinates may be prepared for specifying the routes of the interconnecting wiring between the circuits 10 or the modules 20. For example, the connection 44 would be designated M–9. This provides for simplification not only in the original design of the equipment but also simplifies the circuit drawings and lends for economical manufacturing of the equipment. Further, any of the modules 20 can be easily and conveniently replaced in the event of malfunction or a change in the equipment design.

While the structure may be utilized in the form explained with the harness 22 laid out flat, to achieve a high packing density as well as rigidity the harness 22 is preferably flexible in order that it may be folded along the dotted vertical lines 45. The flexible harness 22 is folded in a series of right angle creases along the lines 45 which are parallel to each other and to the arm 34 of the harness 22. Folding the harness 22 along the vertical lines 45, starting from the left and folding to the right as viewed in FIG. 3, after the first fold the lower left hand module 20 will come into position under the second lowest module 20. After the next fold, the first two modules will come into position under the third module and so on until, as shown in FIG. 7, a column 46 of modules 20 stacked one on top of the other with the flexible harness 22 wrapped therearound is formed. The folding operation can be clearly understood by viewing FIGS. 7 and 8 which show steps in the operation of forming the columnar shaped electrical assembly 46. The stacked column 46 may then, for example, be mounted, as shown in FIG. 9 on a rigid printed circuit wiring board 50 which forms a portion of the overall electrical equipment. As shown in FIGS. 8 and 10, the signal pads 33 may be connected by means of electrical rivet connections 51 to the board 50 and thence to other portions of the electrical equipment.

Access to all of the terminals including signal, power and ground terminals may be achieved by exposing the conductors 25, 40, 41 and 42 along the back of the harness 22 as viewed in FIGS. 3, 9 and 11. A portion of the insulating sheets 30 and 31 is removed to bare the conductors 25, 40, 41 and 42.

Figures 12, 13, 14:
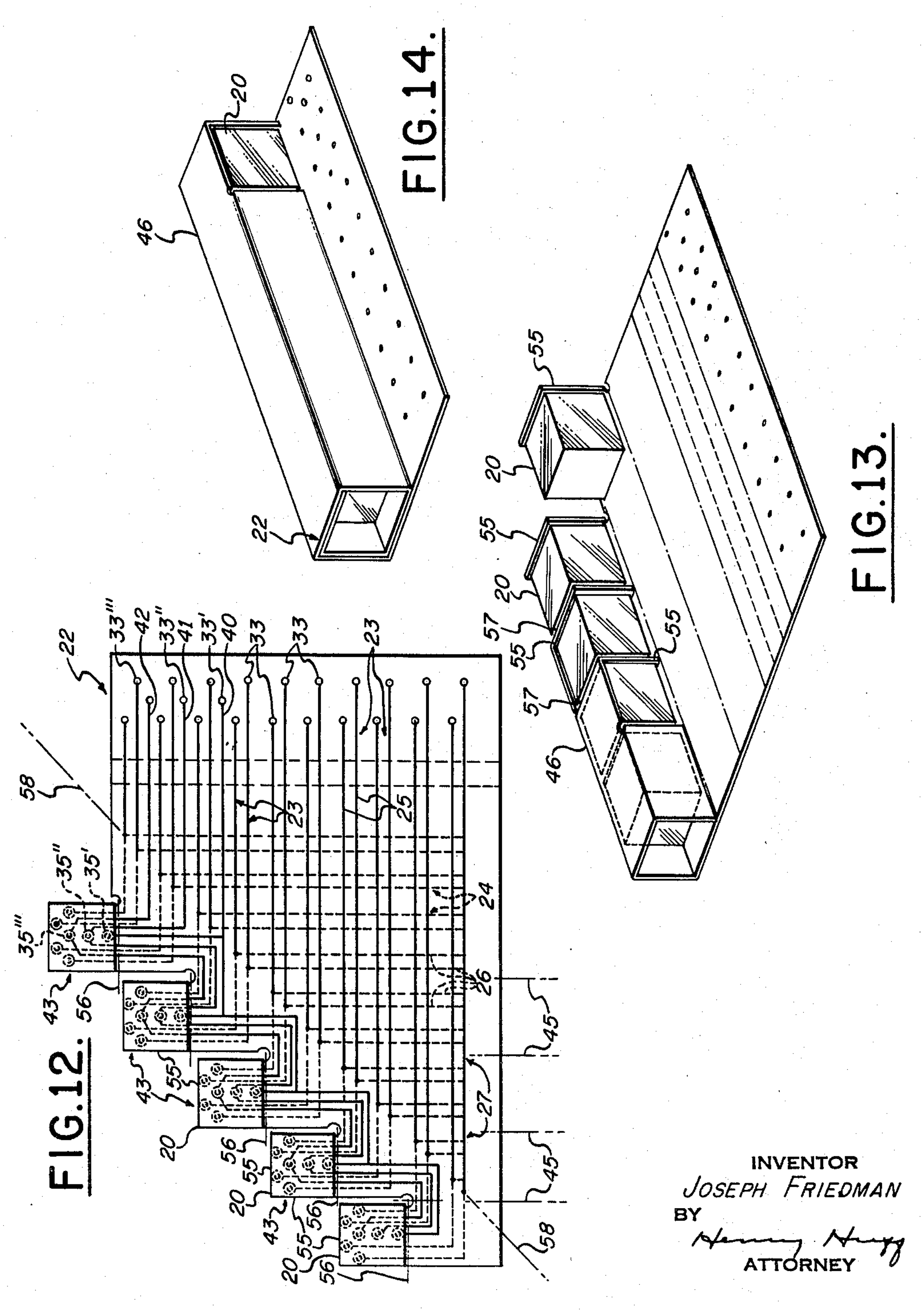
FIG. 12 is a view similar to FIG. 3 of an alternative form of an electrical assembly before folding.
FIG. 13 shows a step in the folding operation of the electrical assembly of FIG. 12.
FIG. 14 shows a further step in the folding operation of the electrical assembly of FIG. 12.

It will be noted by viewing FIGS. 7 and 8 that as the modules 20 are folded the terminals projecting therefrom extend outwardly from each side of the column thus requiring a space 52 between the wrappings of the harness 22 equal to the length of the protruding terminals and extending along the entire length of the column 46. To improve the packing density, the alternative embodiment shown in FIG. 12 may be utilized. The embodiment of the invention shown in FIG. 12 provides the maximum packing density since all of the terminals of the modules 20 within the column 46 extend in the same direction in a manner to be described. In FIG. 12 like reference characters have been applied to like elements with respect to the embodiment of FIG. 3.

For simplicity in FIG. 12 each of the conductors 25 in the first layer 23 is indicated by a single solid line while each of the conductors 26 in the second layer 24 is indicated by a single dotted line. The diagonals of the side 21 from which the terminals of the modules 20 protrude are again aligned with the modules 20 disposed adjacent to each other in stair step fashion. In this embodiment however, the harness 22 has a different configuration as shown with the terminal pad clusters 43 mounted on respective projections 55 which extend from the body of the harness 22. The projections 55 permit the modules 20 to be folded at right angles about their respective horizontal lines 56 in order that their terminals all extend in an upward direction as viewed in FIG. 12. The modules 20 are then in a position similar to that shown in FIG. 3 except their terminals all extend in the same upward direction. The harness is then folded along the vertical dotted lines 45 in a manner similar to that described above with respect to FIG. 3 with the modules coming into place one on top of the other to form a stacked column 46 as shown more clearly in FIG. 13. The terminals of each of the modules 20 which protrude through the projections 55 extend in a rightward direction as viewed in FIG. 13 thus requiring only a small space 57 between each of the modules 20. As shown more clearly in FIG. 14, this permits the harness 22 to be wrapped tightly around the modules 20 and eliminates the intervening space 52 shown in FIG. 8 between the wrappings of the harness 22 thereby providing the maximum packing density of the modules 20 within the column 46.

In order to permit all the terminals of the modules 20 to extend in the same direction within the column 46, the configuration of the lattice 27 of the harness 22 of FIG. 12 is somewhat different from that of FIG. 3. In FIG. 12, the cluster 43 has four signal terminal pads 35, one ground potential pad 35′ and two power pads 35″ and 35‴. The ground and power conductors 40, 41 and 42 respectively are disposed in the upper layer 23 of the harness 22 and interconnect the respective ground and power terminals of the modules 20. The signal conductors 25 in the upper layer 23 extend horizontally from their respective signal pads 33 to a point which lies on a line 58. Each of the conductors 26 of the layer 24 extends vertically from a point directly beneath the lowest conductor 25 to a point directly beneath the termination of the associated horizontal conductor 25 along the line 58. The conductors 26 are then disposed horizontally and thence vertically to connect with their respective terminal pads 35. The conductors 25 are connected to respective conductors 26 at the points where they overlap along the line 58, thereby again providing a lattice 27 by means of which any module 20 may be connected to any other module 20. The conductors 25 are bared along one fold of the harness 22 in order to provide access to the signals thereon as explained more fully with respect to the embodiment of FIG. 3.

While the invention has been described with respect to a predetermined number of terminals 33 and 35, modules 20 and a particular type of circuit 10, it will be appreciated that a column 46 may consist of modules 20 containing identical circuits or different circuits, also the interconnections may be made between any group of circuits within a column 46 and the column 46 may in turn be connected in a variety of ways to other circuits in other columns and also to circuits external to the column 46. It will also be appreciated that the columns 46 themselves may be stacked using similar techniques to provide a high packing density. While it is desirable to have the modules 20 the same size and shape in order to provide a high packing density, they may be of any convenient shape consistent with the overall requirements. Although the electrical components 11 and 12 have been shown encapsulated within a module 20, the components may be mounted directly on the harness 22. In addition, the conductors 25 and 26 have been shown perpendicular with respect to each other but they may be canted at a slight angle with respect to each other providing the lattice 27 remains capable of performing the interconnection function.

Further, many tabular forms for indicating the various interconnections may be devised only one of which has been explained above for purposes of example.

It will be appreciated that maximum standardization will in most instances accrue maximum advantages from the invention. In the preferred embodiment of the invention, the number and orientation of the terminal pads of all of the clusters 43 will be the same, i.e. standard, and will correspond to the number and orientation of the signal and power terminals of the modules 20; also, the number and orientation of the terminals of all the modules 20 as well as the size and shape of all the modules will be the same, i.e. standard, although, in general a variety of different circuits may be encapsulated in the standard module form. Circuits that require a number of terminals for input and output connections which is in excess of the number of terminals provided in the standard module are subdivided and portions of the circuit are encapsulated in two or more separate standard modules as required. The modules containing portions of the subdivided circuit will be interconnected by means of the harness 22 thereby constructing the aforementioned circuit, however complex, in the standard packaging configuration.

When the invention is applied in the manner described immediately above, the following advantages accrue: (1) Reduces design time since the problem reduces itself to a simple bookkeeping problem instead of a design problem. All circuit interconnections are possible. The harnesses may be specified from the logic diagram by following a formula. (2) Reduces cost of printed circuitry since only one harness type is necessary for all circuits. (3) Simplifies drawings since a list of the sequence of module types in a package and a table of interconnection points in the form of grid coordinates takes the place of drawings showing pictures of components to specify their relative locations and pictures of the routes of interconnecting wiring. (4) Reduces space since the modules are stacked one on top of the other with no dead space regardless of the complexity or number of interconnections. (5) Reduces ordering and procurement time since the modules and harnesses may be manufactured before the logic design is completed. (6) Reduces weight since the flexible harness weighs less than rigid printed circuit board. (7) Increases rigidity since the wrap around feature contributes to rigidity of the assembled package.

The invention is particularly adaptable to automation techniques, with all the accompanying benefits. Specific areas in which automation techniques may be applied are as follows: (1) Mass production techniques may be applied to the manufacture of the modules. (2) Mass production techniques may be applied to the manufacture of the harness. (3) A computer may prepare the lists and tables from the logic design drawings. (4) A programmed machine may make the required interconnection joints in the harnesses, making use of the grid system. (5) A programmed machine may select modules in the required sequence and insert them into the harness. The relative positions of the modules and its harness are always the same. (6) The soldering and trimming of module leads may be automated. (7) The folding of the flexible harness, always the same for all harnesses, may be automated, which completes the module package.

While the invention has been described in its preferred embodiments, it is to be understood that the words which have been used are words of description rather than of limitation and that changes within the purview of the appended claims may be made without departing from the true scope and spirit of the invention in its broader aspects.

What is claimed is:

1. An electrical assembly comprising a flexible printed wiring harness consisting of two overlapping layers of printed electrical conductors, the conductors in one layer being parallel to each other and substantially perpendicular to each of the conductors in the other layer thereby forming a lattice of overlapping printed conductors, means for insulating said conductors, a plurality of electrical modules each having terminals connected to at least one conductor in each of said layers, said modules and said conductors being so disposed and relatively arranged that any one of said terminals may be connected to any other terminal by means of said lattice, said modules being further arranged in order that when said flexible harness is folded along predetermined lines, the modules are stacked one on top of the other in close proximity with each other with the flexible harness wrapped around the stacked modules to form a column, and electrically conductive means connecting selected overlapping conductors of said lattice at a point where they overlap for providing electrical connections between selected terminals.

2. An electrical assembly comprising a flexible printed wiring harness substantially in the shape of a truncated right triangle consisting of two overlapping layers of printed electrical conductors, the conductors in one layer being parallel to each other and substantially perpendicular to each of the conductors in the other layer thereby forming a lattice of overlapping printed conductors, one layer of said conductors extending from an arm of said triangle to substantially the hypotenuse of said triangle and the other layer of said conductors extending from the other arm of said triangle to substantially the hypotenuse of said triangle, means for insulating said conductors, a plurality of rectangle-parallelepiped-shaped electrical modules, each of said modules being identically shaped and having electrical terminals extending from a similarly shaped side thereof, each of said modules being connected by means of said terminals to at least one conductor in each of said layers, said modules being disposed adjacent to each other in stair-step fashion with the diagonals of said side aligned and substantially parallel to the hypotenuse of said triangle, said modules and said conductors being so disposed and relatively arranged that any one of the terminals of said modules may be connected to any other terminal by means of said lattice, said modules being further arranged in order that when said flexible harness is folded along predetermined lines, the modules are stacked one on top of the other in close proximity with each other with the flexible harness wrapped around the stacked modules to form a columnar electrical assembly, and electrically conductive means connecting selected overlapping conductors of said lattice at a point where they overlap for providing electrical connections between selected terminals.

3. An assembly of the character described in claim 2 in which said harness includes additional printed electrical conductors disposed substantially parallel to said hypotenuse and cooperative with a portion of each of said modules, said modules including electrical terminals disposed in said portion thereof connected to said additional conductors.

4. An assembly of the character described in claim 2 including exposing at least a portion of said conductors along one side of said columnar electrical assembly thereby providing access to the electrical signals associated with said modules.

5. An electrical assembly comprising a flexible printed wiring harness consisting of two overlapping layers of printed electrical conductors, a substantial portion of the conductors in one layer being parallel to each other and perpendicular to a substantial portion of each of the conductors in the other layer, the substantial portions of said conductors thereby forming a lattice of overlapping printed conductors, means for insulating said conductors, a plurality of rectangular-parallelepiped-shaped electrical modules, each of said modules being identically shaped and having electrical terminals extending from a similar shaped side thereof, each of said modules being connected by means of said terminals to at least one conductor in each of said layers, said modules being disposed adjacent to each other in stair step fashion with the diagonals of said side aligned, said modules and said conductors being so disposed and relatively arranged that any one of the terminals of said modules may be connected to any other terminal by means of said lattice, said modules being further arranged in order that when said flexible harness is folded along predetermined lines, the modules are stacked one on top of the other in close proximity with each other with said terminals extending in the same direction with the flexible harness wrapped around the stacked modules to form a columnar electrical assembly, and electrically conductive means connecting selected overlapping conductors of said lattice at a point where they overlap for providing electrical connections between selected terminals.

6. An assembly of the character described in claim 5 in which said harness includes additional printed electrical conductors cooperative with a portion of each of said modules, said modules including electrical terminals disposed in said portion thereof connected to said additional conductors.

7. An assembly of the character described in claim 5 including exposing at least a portion of said conductors along one side of said columnar electrical assembly thereby providing access to the electrical signals associated with said modules.

References Cited in the file of this patent

UNITED STATES PATENTS

| | | |
|---|---|---|
| 2,590,821 | Kiser | Mar. 25, 1952 |
| 2,682,018 | Phillips | June 22, 1954 |
| 2,816,253 | Blitz | Dec. 10, 1957 |
| 2,932,772 | Bowman | Apr. 12, 1960 |

OTHER REFERENCES

Selectacon Engineering Bulletin No. 9, published November 1958, pages 2 to 9.

Edward Keonjion: "Microminiaturizing a Space Vehicle Computer," Electronics, published Apr. 29, 1960, pages 95 to 98.